(12) United States Patent
Chang

(10) Patent No.: US 7,645,150 B1
(45) Date of Patent: Jan. 12, 2010

(54) CARD EDGE CONNECTOR

(75) Inventor: Wen-Chang Chang, Keelung (TW)

(73) Assignee: Lotes Co., Ltd, Keelung (TW)

( * ) Notice: Subject to any disclaimer, the term of this patent is extended or adjusted under 35 U.S.C. 154(b) by 0 days.

(21) Appl. No.: 12/270,948

(22) Filed: Nov. 14, 2008

(51) Int. Cl.
*H01R 13/62* (2006.01)
(52) U.S. Cl. .................................. 439/157; 439/372
(58) Field of Classification Search ............ 439/157, 439/160, 372
See application file for complete search history.

(56) References Cited

U.S. PATENT DOCUMENTS

| | | | | |
|---|---|---|---|---|
| 5,429,523 | A * | 7/1995 | Tondreault | 439/157 |
| 7,029,298 | B2 * | 4/2006 | Jiang | 439/157 |
| 7,083,448 | B2 * | 8/2006 | Tanigawa | 439/160 |
| 7,438,569 | B2 * | 10/2008 | Pennypacker et al. | 439/157 |
| 2009/0077293 | A1 * | 3/2009 | Kerrigan et al. | 710/301 |

* cited by examiner

*Primary Examiner*—Hae Moon Hyeon
(74) *Attorney, Agent, or Firm*—Ming Chow; Sinorica, LLC

(57) ABSTRACT

The card edge connector is provided. An electrical connecting unit has a slot used for connecting component to insert into, the electrical connecting unit has at least one pivot unit, a retaining device hinges to the pivot unit, and corresponding to the connecting component along the pivot rotation area, the retaining device has an exerting area, and the exerting area has at least a handle unit. The card edge connector, the retaining device has at least one tool operating slot and at least one handle unit, when the connecting component is ejected, the space on the mother board is too small to exerting the force on to said handle unit, an auxiliary tool makes the tool operating slot eject the connecting component, if the space on the mother board is big enough to exerting the force on to the handle unit, then the handle unit ejects the connecting component.

11 Claims, 4 Drawing Sheets

CARD EDGE CONNECTOR

FIELD OF THE INVENTION

The present invention relates to a card edge connector, and more particularly, to a card edge connector comprising a retaining device.

BACKGROUND OF THE INVENTION

Card edge connectors normally comprise retaining devices oil their two sides for cassette electronic components which contacts to the edge of card edge connectors to retain on the corresponding electrical circuit boards. When cassette electronic components are inserted into card edge connectors, cassette electronic components are electrically connected to the corresponding electrical circuit boards. Retaining devices make cassette electronic components connect to the card edge connectors firmly, to prevent the signal break off by shaking, and cassette electronic components are ejected from card edge connectors easily through rotating retaining devices. The China Patent Application Number 01273845 disclosed one of the related present invention, as shown in the FIG. 2, the card edge connector including an insulation body 2, plurality of terminals 4 which is set up inside of the insulation body 2, a pair of eject structures 1 set up on the two sides of the insulation body, said eject structure 1 is used to retain or to eject the sub-board 3 in the card edge connector, the eject structure comprises a main body 10, a eject portion 11, a locking unit 12, a exerting unit 13, a pivot unit 14, an interfere unit 17. When the sub-board 3 is ejected, our hands press on the exerting unit 13 and the pivot unit 14 of the eject structure 14 will spin, then the locking unit 12 ejects from a slot 30 of the sub-board 3, at the same time, the eject portion 11 pushes the sub-board 3 from bottom to top, until the interfere unit 17 reaches the bottom of the insulation body 2, then the sub-board 3 is ejected from the slot 20 of the insulation body 2.

Although it is very convenient to eject the sub-board 3 by applying the hand manual system to the exerting unit 13, the more space will be taken if the sub-board 3 is ejected from the card edge connector by using the exerting unit 13, thus applying the hand manual system to the exerting unit 13 can only be successful when the space of the mother board is big enough. Furthermore to satisfy the market demand, electronic products (i.e. the laptop) are becoming thinner and lighter than those before, when the number of electronic products increases, the amount of the card edge connectors used on the mother board also increases, and the space of the mother board will decrease, when the space of the mother board is too small to enable the hand manual system to the exerting unit 13, said sub-board can not be ejected. Therefore it is necessary to design a new type of card edge connector in order to solve the problem describe above.

SUMMARY

An objective of the present invention is to provide a card edge connector, which can eject connecting components under two different types of conditions.

A card edge connector in the present invention is to provide a card edge connector used for connecting a connecting component on the electrical circuit board, and said card edge connector includes an electrical connecting unit, and said electrical connecting unit has a slot used for the connecting component to insert, at least one side of said electrical connecting unit corresponding to the slot has a pivot unit. A retaining device hinges to said pivot unit, said retaining device is corresponding to and clipped to said connecting component along a pivot rotation area, said retaining device has an exerting area, whose indentation area forms at least one tool operation slot, and the protruding area of the exerting area wherein has at least one handle unit.

The present invention is to provide a card edge connector, said retaining device has at least one tool operation slot and at least one handle unit, when the connecting component is ejected from the card edge connector, if the space on the mother board is too small to exert the force on the handle unit by hands, an auxiliary tool is applied in order to push down the handle unit and eject the connecting component by said operation tool, if the space on the mother board is big enough the handle unit is used to eject said connecting component by hands.

DETAILED DESCRIPTION

In order to make the structure and characteristics as well as the effectiveness of the present invention to be further understood and recognized, the detailed description of the present invention is provided as follows along with preferred embodiments and accompanying figures.

FIGS. 1 to 4 show the objective of the card edge connector is to electrically connect with a connecting components 300 to the electrical circuit board (not shown in the figure), said card edge connector includes an electrical connecting unit 1 and a retaining device 2 hinged to one side of the electrical connecting unit 1. Furthermore, two or more retaining device 2 hinged to one side of the electrical connecting unit 1.

Figure 1:
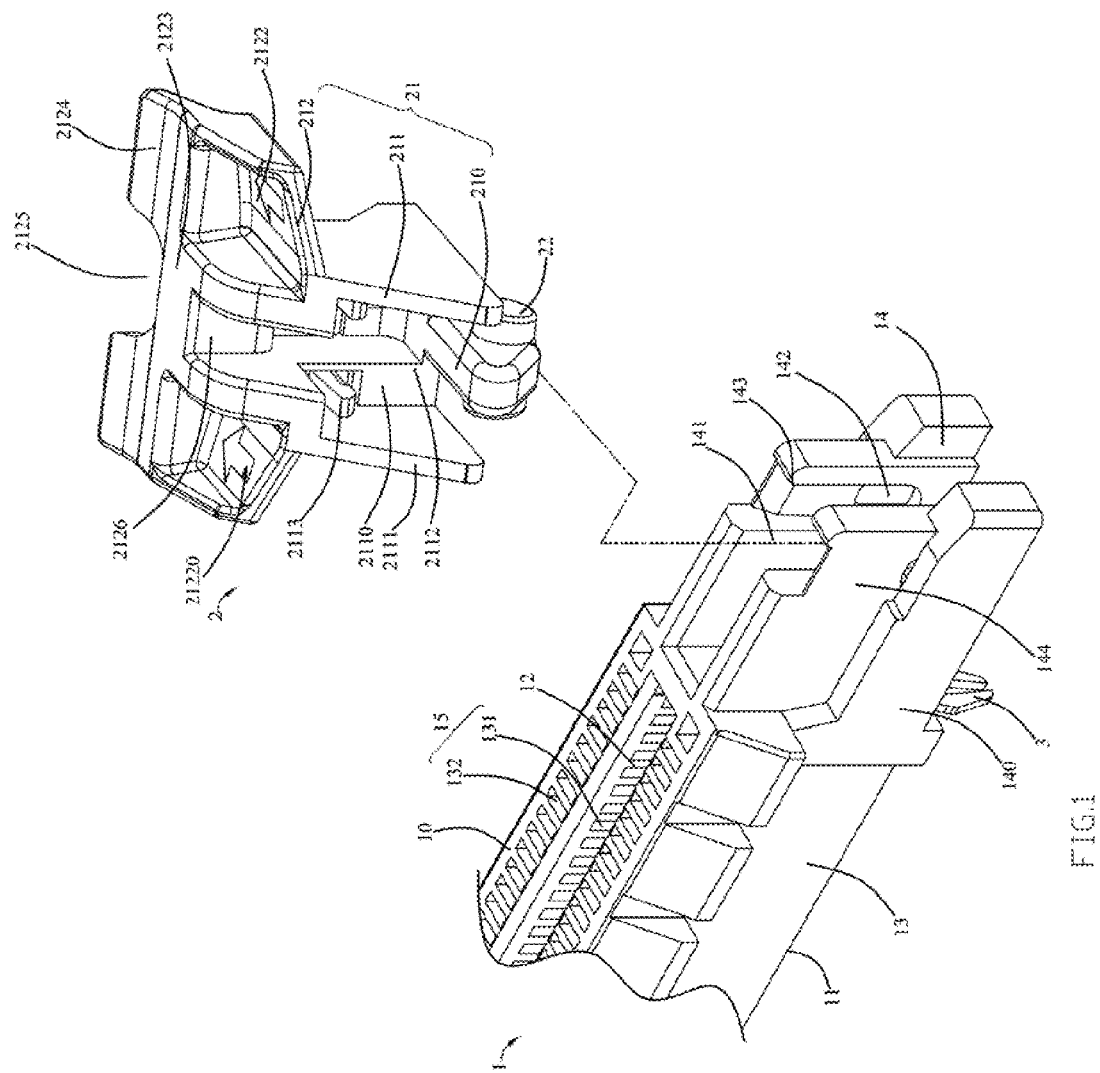
FIG. 1 shows a perspective view of the card edge connector.
Figure 2:
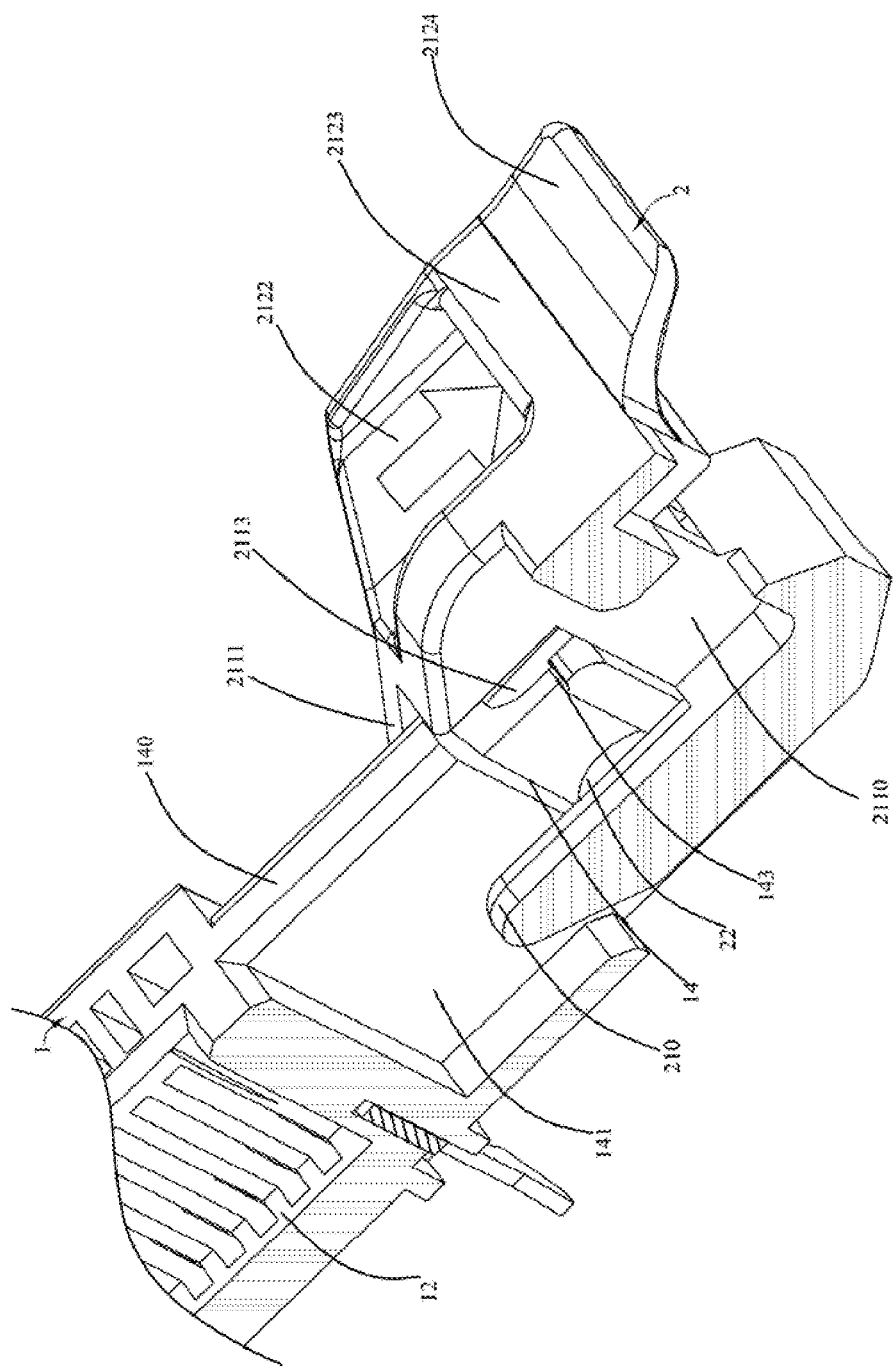
FIG. 2 shows a partially cross-section view of the card edge connector shown in FIG. 1.
Figure 3:
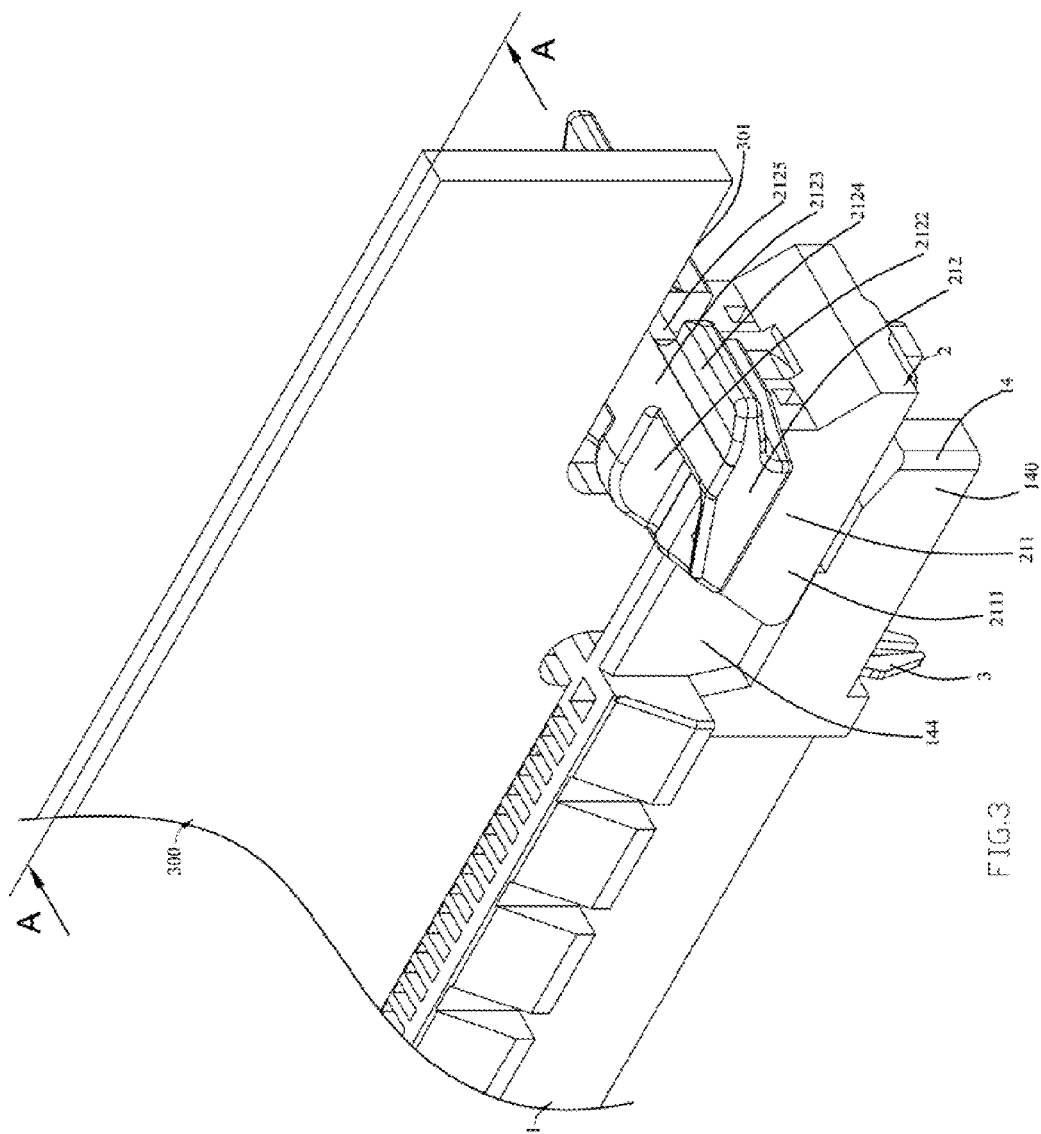
FIG. 3 shows a partially perspective view of the card edge connector shown in FIG. 1 and the corresponding connecting component.

As shown in FIGS. 1 and 2, said electrical connecting unit 1 is lengthwise, which has a top surface 10 and a bottom surface 11, which is parallel to the top surface 10, at the middle of said top surface 10 of said electrical connecting unit 1 has a slot 12, which is used to connect the connecting component 300, in the front and back sides of said slot 12 set on said electrical connecting unit 1 have sides 13 respectively, said side 13 inside of said slot 12 has a plurality of contact channels 131, said side 13 has a plurality of contact holes 132 which linked through the top surface 10 and the bottom surface 11 of said electrical connecting unit 1, said contact hole 132 through said contact channel 131 form a terminal slot 15, each terminal slot 15 receives a conductive terminal (not shown in the figure). One side of said slot 12 of said electrical connecting unit 1 extends to form a pivot unit 14, whose front and back sides have side plates 140 respectively, a groove 141 is formed between two of the side plates 140, wherein at least one of the side plates 140 has one pivot hole 142, in the embodiment, each side plate 140 forms the pivot hole 142, at least one of the side plates 140 has a flute 143 inside, each side plate 140 has an indentation area 144 outside. On the two sides of said bottom surface 11 of said electrical connecting unit 1 has a fixing hole, said fixing hole has a fixing unit 3 used to fix the card edge connector on the electrical circuit board.

Figure 4:
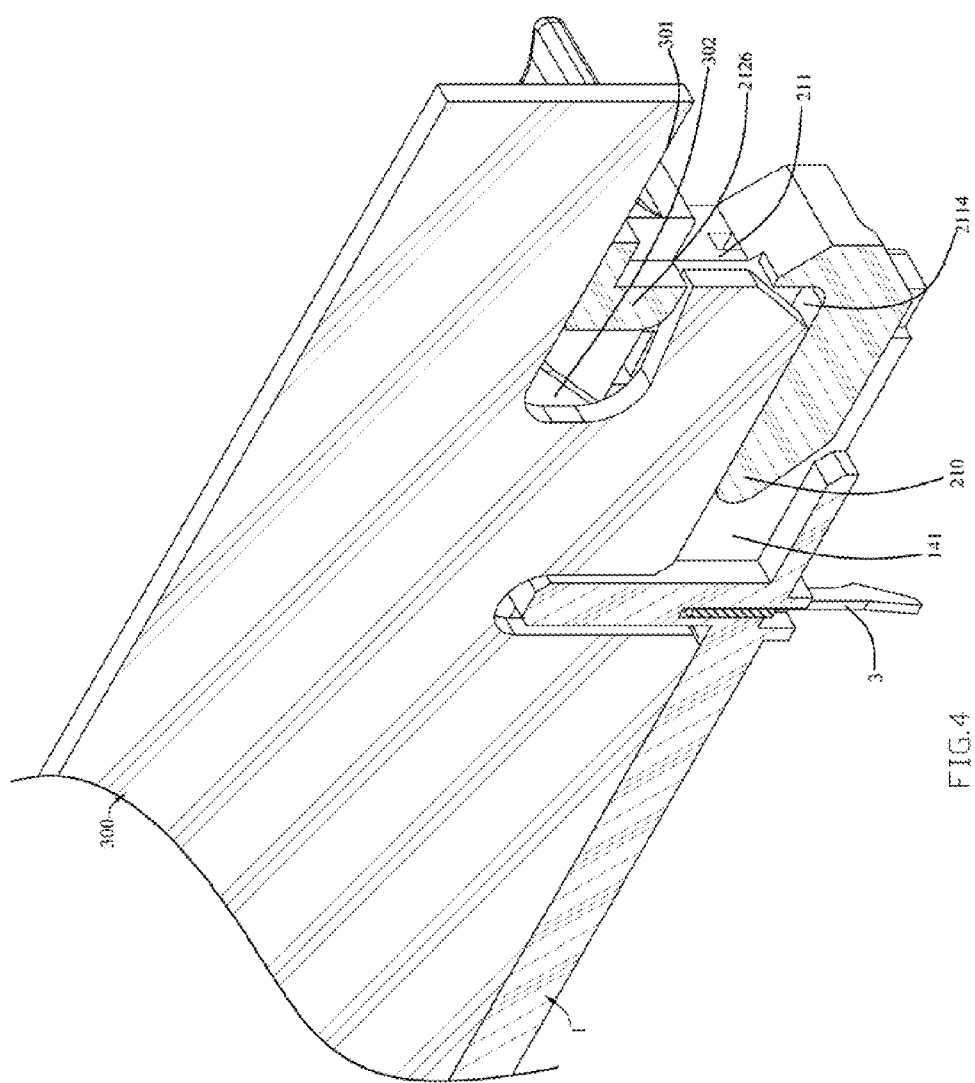
FIG. 4 shows a cross-section view along the A-A direction shown in FIG. 3.

FIGS. 1, 2 and 4 show that said retaining device 2 is hinged to the pivot unit 14 of the electrical connecting unit 1, said retaining device 2 is corresponding and retained to the connecting component 300 along a pivot rotation area and said retaining device 2 has a base 21, said base 21 comprises a eject portion 210, said eject portion 210 extends upward and forms a buckling unit 211 and said buckling unit 211 extends upward and forms an exerting area 212, one side of said eject portion 210 of said retaining device 2 has at least one pivoting axle 22, in the embodiment, two protuberant sides of said eject portion 210 of said retaining device 2 have said pivoting axles 22 respectively, said pivoting axle 22 is corresponding to and hinged to and put around the pivot hole 142 of the pivot unit 14, said retaining device 2 can rotate in certain angles by setting up said pivoting axle 22 inside said pivot unit 14 of the groove 141 as the center of the axle. Said eject portion 210 is under said connecting component 300, which is used to push up said connecting component 300 from said slot 12, said eject portion 210 is hinged to the pivot unit 14 in the groove 141, said buckling unit 211 clips to said connecting component 300, a main body 2110 is formed by said eject portion 210 which extends upward and two sides of said main body 2110 form a pair of positive wing unit 2111, said main body 2110 and said pair of wing unit 2111 surround to form a spacing unit 2112, said pair of wing units 2111 is corresponding to and clipped to said two indentation area 144 outside two of said side plates 140, a portion of side plate 140 is received in said spacing unit 2112. The main body 2110 in said spacing unit 2112 has a corresponding two buckling units 2113, said two buckling units 2113 buckle to said flute 143 of said pivot unit 14, therefore said retaining device 2 will not be ejected from said electrical connecting unit 1 by outer vibration, said exerting area 212 has a flat surface 2123, the indentation area of said exerting area 212 forms a tool operation slot 2122, and said exerting area 212 wherein is protruding area has at least one handle unit 2124, in this embodiment, two opposite sides of said exerting area 212 is corresponding to two sides of said slots 12, each side has an tool operation slot 2122 and a handle unit 2124 respectively. Two sides of said tool operation slot 2122 have openings 21220 respectively, and said two openings 21220 are connected to each other, one of the openings 21220 is on the up side of said tool operation slot 2122, and another opening 21220 is on the side of said tool operation slot 2122, which is facing said slot 12, hence a side of said tool operation slot 2122 which is facing said slot 12 has no side wall. Said handle unit 2124 inclines upwards, which is convenient for exerting the force, between said two handle units 2124 forms an alignment slot 2125, in order to eject said connecting component 300. When said connecting component 300 is inserted into said slot 12 of said electrical connecting unit 1, the bottom side 301 of said connecting component 300 contacts to said flat surface 2123, the connecting component 300 is through the alignment slot 2125, the length of said connecting component 300 is not limited. In additional, said exerting area 212 which is between two of said tool operation slots 2122 has a locking unit 2126, said locking unit 2126 is cooperative with a notch 302 of said connecting component 300, said connecting component 300 is fixed on the electrical connecting unit 1.

When said connecting component 300 is ejected from said card edge connector, if the space of the mother board is too small to apply hand manual system to said handle unit 2124 of said retaining device 2 for ejecting said connecting component 300, an auxiliary tool can be applied (said auxiliary tool can be any type of tools which press down the retaining device 2, screw driver, a pencil . . . etc) to press down the tool operation slot 2122 of the retaining device 2, at the same time said retaining device 2 will spin outwards and makes said locking unit 2126 eject from the notch 302 of said connecting component 300, said eject portion 210 pushes said connecting component 300 upwards, in order to take out said connecting component 300, this is to achieve the goal of ejecting said connecting component 300. In other word, if the space of the mother board is big enough to eject said connecting component 300 by applying the hand manual system to said handle unit 2124 of said retaining device 2, exerting an inclining force to the handle unit 2124 by hands, this can also achieve the goal of ejecting the connecting component 300 and it is very convenient to eject the connecting components by hands, this can be used any time any where.

Furthermore said retaining device 2 has two operation slots 2122, which are on two sides of said connecting component 300, when the space of one side of the card edge connector is not big enough, the auxiliary tool is not able to push down the tool operation slot 2122 in order to eject the connecting component 300, therefore said auxiliary tool is used to push down another tool operation slot 2122 of said retaining device 2 to eject the connecting component 300, in other word, there are two handle units 2124 on said retaining device 2 and they are set on two sides of the connecting component 300, it is convenient to choose one of them to eject the connecting component 300 in different situations.

The card edge connector according to the present invention has the following advantages:

1. said retaining device 2 has at least one of the tool operating slot 2122 and at least one of the handle unit 2124, when the connecting component 300 is ejected from the card edge connector, if the space of the mother board is not big enough to exert the force to the handle unit 2124, an auxiliary tool is used for pressing down the tool operation slot 2122 to eject the connecting component 300, if the space of the mother board is big enough to make the handle unit 2124 work, then the handle unit 2124 work to eject the connecting component 300.
2. Two of opposite sides on said exerting area 212 are corresponding to two sides of said slot 12, each side has said tool operation slot 2122 and said handle unit 2124, when said connecting component 300 is ejected, people are used to facing the side 13 close to said slot 12 of said electrical connecting unit 1, and said auxiliary tool is convenient to exert the force to the handle unit 2124 or the tool operation slot 2122 on the same side of side 13, this is ergonomics.
3. Two of opposite sides on said exerting area 212 are corresponding to two sides of said slot 12, each side has said tool operating slot 2122, on the two sides of said tool operating slot 2122 has an opening 21220 respectively, these two openings 21220 are also connected to each other, said auxiliary tool is able to work in vertical and horizontal dimensions in order to eject the connecting component 300, to exert a force to said tool operating slot 2122, in order to achieve the goal of ejecting said connecting component 300. Thus, the work area of said auxiliary tool is wide.

The invention claimed is:

1. A card edge connector, used for a connecting component to electrically connected with an electrical circuit board, comprising:
   an electrical connecting unit, said electrical connecting unit having a slot for said connecting component to insert into, at least one end of said electrical connecting unit having a pivot unit; and
   at least one retaining device hinging to the pivot unit, said retaining device being corresponding to and clipped to said connecting component along a pivot rotation area, said retaining device having an exerting area, said exerting area being sunken and forming at least one tool operation slot, and at least one handle unit protruding from the exerting area, and each said tool operation slot having two openings, each said opening being formed on each side wall of the tool operation slot, and the two openings connecting to each other.

2. The card edge connector as claimed in claim 1, wherein said handle unit is inclined up.

3. The card edge connector as claimed in claim 1, wherein two opposing sides of the exerting area are opposite to two sides of said slot, said tool operation slot and said handle unit are on each side of the exerting area respectively.

4. The card edge connector as claimed in claim 3, further comprising:
a flat surface defined between the tool operation slot and the handle unit, the bottom of said connecting component contacting to said flat surface.

5. The card edge connector as claimed in claim 1, further comprising:
an alignment slot formed between two of said handle units.

6. The card edge connector as claimed in claim 1, wherein said retaining device has a base, said exerting area is set on said base, at least one protuberant side of said retaining device on said base has one pivoting axle, said pivot unit has at least one pivot hole for said pivoting axle.

7. The card edge connector as claimed in claim 6, wherein said pivot unit has two corresponding side plates, said two side plates form a groove in between, said pivoting axle is engaged in said groove, and said pivot hole are defined in said groove.

8. The card edge connector as claimed in claim 7, wherein the outside of two side plates of said pivot unit are clamped correspondingly by two opposite sides of said base.

9. The card edge connector as claimed in claim 6, wherein said base has a eject portion being underneath said connecting component.

10. The card edge connector as claimed in claim 9, wherein said pivoting axel is formed on said eject portion.

11. The card edge connector as claimed in claim 9, wherein said pivot unit has two side plates wherein a groove is formed in between, said eject portion is located in said groove.

\* \* \* \* \*